(12) United States Patent
Wang et al.

(10) Patent No.: US 11,762,480 B2
(45) Date of Patent: Sep. 19, 2023

(54) KEY DETERMINATION METHOD FOR METAL KEY

(71) Applicants: Mettler-Toledo (Changzhou) Measurement Technology Ltd., Changzhou (CN); Mettler-Toledo (Changzhou) Precision Instruments Ltd., Changzhou (CN); Mettler-Toledo International Trading (Shanghai) Co., Ltd., Shanghai (CN)

(72) Inventors: Jingke Wang, Changzhou (CN); Shujun Wang, Changzhou (CN); Shenjian Qian, Changzhou (CN); Yong Yang, Changzhou (CN)

(73) Assignees: Mettler-Toledo (Changzhou) Measurement Technology Ltd., Changzhou (CN); Mettler-Toledo (Changzhou) Precision Instruments Ltd., Changzhou (CN); Mettler-Toledo International Trading (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 17/789,855

(22) PCT Filed: Dec. 29, 2020

(86) PCT No.: PCT/CN2020/140518
§ 371 (c)(1),
(2) Date: Jun. 29, 2022

(87) PCT Pub. No.: WO2021/136220
PCT Pub. Date: Jul. 8, 2021

(65) Prior Publication Data
US 2023/0033782 A1     Feb. 2, 2023

(30) Foreign Application Priority Data
Dec. 31, 2019   (CN) .......................... 201911420226.6

(51) Int. Cl.
G06F 3/03   (2006.01)
G06F 3/02   (2006.01)

(52) U.S. Cl.
CPC ............. *G06F 3/03* (2013.01); *G06F 3/0202* (2013.01)

(58) Field of Classification Search
CPC ................................. G06F 3/03; G06F 3/0202
See application file for complete search history.

(56) References Cited

U.S. PATENT DOCUMENTS 5,798,716 A * 8/1998 Davis .................... G06F 1/1662
341/26
10,289,850 B2   5/2019 Parker et al.
(Continued)

FOREIGN PATENT DOCUMENTS

CN         205487870 U      8/2016
CN         106033966 A     10/2016
(Continued)

*Primary Examiner* — Amit Chatly
(74) *Attorney, Agent, or Firm* — Standley Law Group LLP; Jeffrey S. Standley; Adam J. Smith

(57) ABSTRACT

A key determination method for a metal key. The method comprises a step of determining whether values output by an electrical parameter converter on a metal key satisfy multiple levels of thresholds, and, a step of setting a press flag of the metal key according to multiple levels of thresholds; and after the metal key is released, determining whether a release flag is valid according to a press model, and if so, clearing the press flag that was previously set. Different press models and different thresholds are selected and configured by means of software, so that personalized choices are provided for respective metal keys, which effectively facilitates different operators in configuring a metal keyboard according to usage habits, thereby improving the operating efficiency. In addition, the setting of different (Continued)

thresholds effectively protects the operational details mean for the exclusive use of operators, thereby achieving the required confidentiality.

15 Claims, 3 Drawing Sheets

(56) References Cited

U.S. PATENT DOCUMENTS

| | | | | |
|---|---|---|---|---|
| 11,099,650 | B1* | 8/2021 | Haynold | G06F 3/0488 |
| 2014/0340317 | A1* | 11/2014 | Rodzeveski | G06F 3/0202 |
| | | | | 200/600 |
| 2019/0172434 | A1 | 6/2019 | Pogoda | |
| 2020/0387245 | A1* | 12/2020 | Chen | G06F 3/0202 |

FOREIGN PATENT DOCUMENTS

| | | |
|---|---|---|
| CN | 106997819 A | 8/2017 |
| CN | 109061452 A | 12/2018 |
| CN | 110474646 A | 11/2019 |

* cited by examiner

KEY DETERMINATION METHOD FOR METAL KEY

BACKGROUND OF THE INVENTION

Technical Field

The present invention relates to a key determination method for a metal key.

Background Art

The existing instrument keys available in the market are of silicone or membrane types, wherein the silicone type of keys are gradually eliminated due to the short service life thereof. The membrane keys are easily damaged, require a high cost of anti-static treatment for keyboards that use them, and have a decreased inter-line insulation when used in a humid environment for a long time, thereby resulting in poor reliability.

Patents CN201610051767.6 and CN201620077553.1 disclose a metal key, in which a processed key is recognized by sensing the displacement of the metal key from an electronic coil, wherein an induction coil is connected to an electrical parameter digital converter, and the electrical parameter digital converter collects the change in the distance between a press key of the metal key and the induction coil, converts the change into a digital signal, and then transmits the digital signal to a microprocessor for processing. However, neither a key determination method nor a method of operating a plurality of metal keys of a keyboard are known in the prior art references. In addition, the current key determination method cannot be applied to such a metal key.

SUMMARY

The object of the present invention is to provide a key determination method for a metal key aiming to overcome the aforementioned deficiencies in the prior art, in which different functions are realized by analysing changes in values output by an electrical parameter converter.

A key determination method for a metal key comprising: determining whether values output by an electrical parameter converter on a metal key satisfy multiple levels of thresholds. The key determination method further comprising setting a press flag of the metal key according to multiple levels of thresholds when the values output by the electrical parameter converter on the metal key satisfy multiple levels of thresholds.

In the present invention, initially the value of the press flag is set to 0, and once the press flag is set, the value changes to 1 and vice versa. Multiple levels of thresholds are set and a level division is carried out on the values output by the electrical parameter converter. An actual value output by the electrical parameter converter is compared with different thresholds, and then a press flag of the metal key is set. By means of the multiple levels of thresholds, the same metal key realizes different functions, and a user can keep an operating mode of the metal key confidential.

Further, a correlation is set between the values output by the electrical parameter converter and the multiple levels of thresholds. Multiple levels of thresholds correspond to different applications.

In the present invention, the values output by the electrical parameter converter correspond to the multiple levels of thresholds on a one-to-one basis, and the correlation may be set according to actual needs of a user. The multiple levels of thresholds comprise thresholds, which are fixed values or values that are dynamically set according to an output signal from a sensor. For example, the value output by the electrical parameter digital converter and ranging between 0 to 10 corresponds to a first level of threshold, the value ranging between 11 to 20 corresponds to a second level of threshold, and so on. Alternatively, the value output by the electrical parameter converter and ranging between 0 to 50 corresponds to a first level of threshold, the value ranging between 51 to 100 corresponds to a second level of threshold, and so on.

The thresholds may also be dynamically adjusted in combination with signals from other sensors. For example, a sensor that senses environmental vibration can adjust the threshold in combination with the strength of a vibration signal to meet more application requirements of a user. For example, a sensor that is installed on a vibrating device can better recognize a man-made pressing operation by detecting the environmental vibration to change a key trigger threshold, without causing false triggering. For example, the vibration caused by environment is at a fixed frequency, while the man-made pressing operation is at a varying frequency, and thus it can be determined, according to the values output by the electrical parameter converter, whether the vibration is regular, and if so, it is considered that the threshold trigger is caused by the vibration due to the environment, and if not, it is considered that the vibration is caused by the man-made pressing operation.

In addition, the method further comprises determining whether the press flag is to be set when the metal key instantaneously obtains a plurality of values output by the electrical parameter converter and all the plurality of values output by the electrical parameter converter satisfy the thresholds. At this step, it is considered that a plurality of metal keys are pressed. Around the same time, a user can set out to determine, according to the numbers of pressed metal keys, whether the vibration is an external interference such as an electromagnetic interference or a human-induced pressing operation. In case, the vibration is determined to be a result of an external interference, no press flag is set.

In a preferred way, the method further comprises a step of determining whether the values output by the electrical parameter converter satisfy the thresholds upon detecting that the press flag of the metal key is valid.

In the present invention, a press model is established according to the values actually output by the electrical parameter converter, and if the press model is consistent with the pre-set press model, it is determined that the press flag of the metal key is valid, otherwise, the press flag thereof is invalid.

In a preferred embodiment of the key determination method, the press flag is valid when the press model of the metal key is consistent with a pre-set model. After it is detected that the press flag of the metal key is valid, it is determined whether the values output by the electrical parameter converter satisfy thresholds.

In an advantageous way, the method further comprises determining a duration for which the press flag of the metal key is set. The press flag of the metal key is cleared when the duration for which the press flag of the metal key is set is greater than a pre-set value. It must be noted that the duration that the press flag of the metal key is set is timed.

In a preferred way, the method further comprises upon releasing the metal key, determining whether a release flag is valid according to a press model. When the release flag is valid, the press flag that was previously set is cleared.

Similarly, a second determination parameter refers to a plurality of continuous values obtained by the electrical parameter converter.

Preferably, upon releasing the metal key, the release flag is valid if the press model of the metal key is consistent with the pre-set press model. A press model is established according to the second determination parameters. If the press model is consistent with a pre-set press model, it is determined that the release flag of the metal key is valid. Otherwise, the release flag thereof is invalid. When it is detected that the release flag of the metal key is valid, the set flag is cleared.

In the present invention, within the duration that the press flag of the metal key is set, the influence of other operations on the pressed metal key is avoided, so that the operation is high in accuracy, simple, reliable, and low in cost. If the duration that the metal key is set exceeds the pre-set value, the press flag is forcibly cleared.

Multiple levels of thresholds are set according to the values output by the electrical parameter converter, and the respective levels of thresholds correspond to different applications, so that the same metal key realizes different functions. For convenience of use, a frequently used function may be set to be easy to trigger, that is, the threshold level is lower, and a function related to a special process is set to be difficult to trigger, that is, the threshold level is higher. The multiple levels of thresholds may be set according to needs of users. By means of the multiple levels of thresholds, external personnel cannot recognize the specific function of pressing, so that the effect of confidentiality is achieved.

Further, the pre-set press model comprises a monotonically increasing model, or a stepwise rising model, or a jitter raising model. It is also envisaged to provide a combined model of any two of the monotonically increasing model, the stepwise rising model, and the jitter raising model. Further, the pre-set press model is a combined model of the monotonically increasing model, the stepwise rising model, and the jitter raising model.

In the present invention, several press models may be pre-set for the metal keys, and the press models are mathematical models fitted from parameters such as multiple continuous change trends of first determination parameters obtained by the electrical parameter converter, e.g., the length of a pressing duration, the speed of a pressing action, and a change trend of a pressing force. The first determination parameter refers to a plurality of continuous values obtained by the electrical parameter converter. The press model can be divided into short press or long press according to the length of the press duration, quick press or slow press according to the speed of pressing, or gradually pressing force-applied press or gradually pressing force-decreased press according to the change trend of a pressing force, or various different key press models formed in any combination of the foregoing press modes. In addition, a simple press model may be used, for example: a monotonically increasing model: the values output by the electrical parameter converter gradually increase at each sampling time; a stepwise rising model: the values output by the electrical parameter converter are alternately increased, maintained, increased, and maintained at each sampling time; a jitter raising model: the values output by the electrical parameter converter are alternately increased, decreased, increased, and decreased at each sampling time; or other combined models with the values output by the electrical parameter converter changed.

In a preferred embodiment, the method comprises: pressing or releasing the metal key; determining whether a press flag or release flag of the metal key is valid according to a press model; when said release flag is valid, setting or clearing the press flag.

Preferably, the method comprises: determining whether values output by an electrical parameter converter on a metal key satisfy multiple levels of thresholds, and setting a press flag of the metal key.

Further provided in the present invention is a metal key applying the key determination method for a metal key hitherto described.

Further provided in the present invention is an electronic instrument applying the metal key hitherto described.

Further provided in the present invention is a storage medium comprising a stored program, wherein the stored program, upon execution, controls an apparatus comprising the storage medium to perform the aforementioned key determination method for the metal key.

In summary, according to the present invention, on the basis of keeping a hardware structure of a metal key unchanged, different press models and different thresholds are selected and configured by means of a software, so that personalized choices are provided for respective metal keys, which effectively facilitates different operators in configuring a metal keyboard according to usage habits, thereby improving the operating efficiency. In addition, the setting of different thresholds effectively protects the operation purposes of the operators, thereby achieving the effect of confidentiality.

BRIEF DESCRIPTION OF THE DRAWINGS

The accompanying drawings, which are included to provide a further understanding of the present invention and are incorporated in and constitute a part of the present application, illustrate embodiments of the present invention and, together with the description, serve to explain the principle of the present invention. In the accompanying drawings.

DETAILED DESCRIPTION OF EMBODIMENTS

Figure 1:
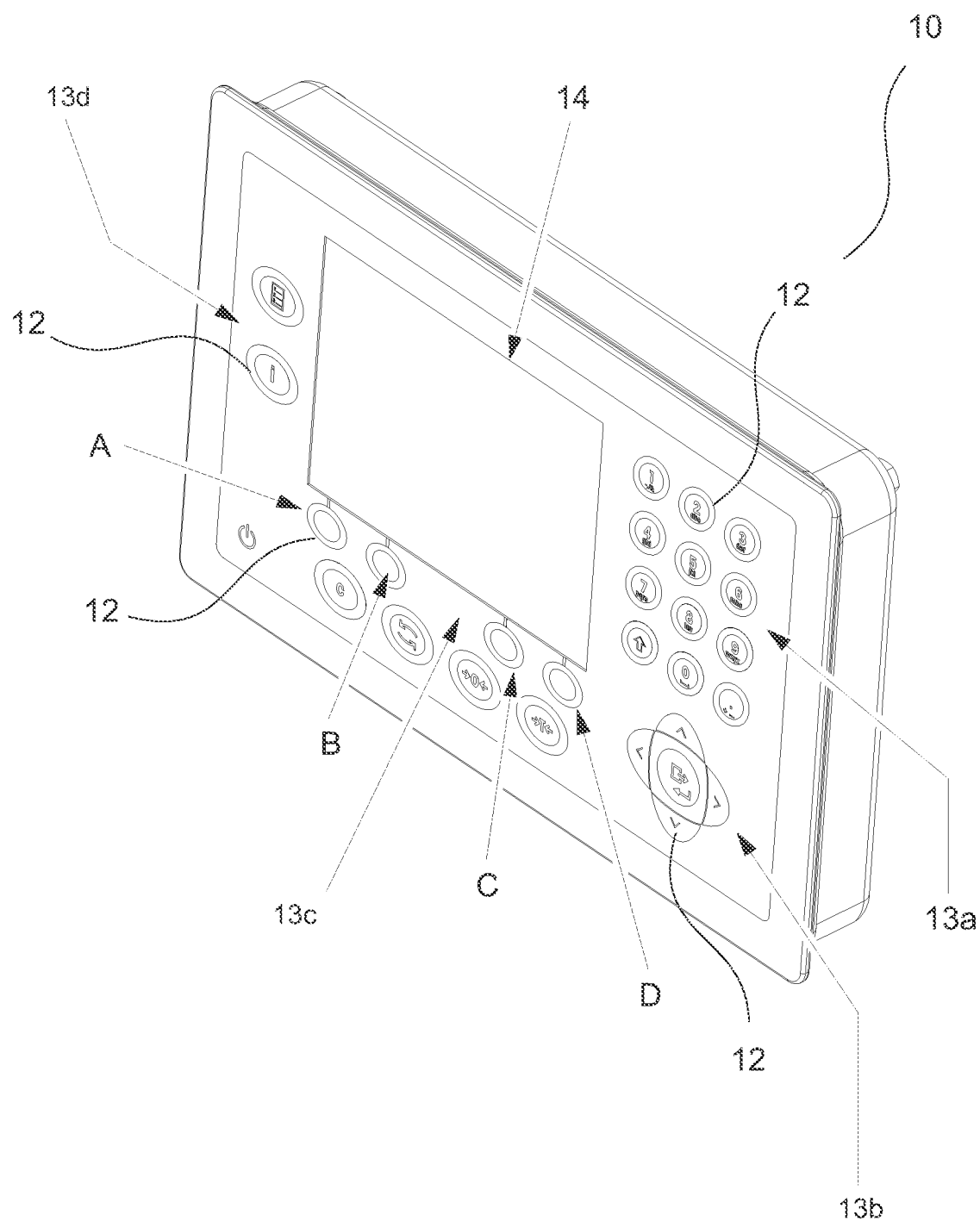
FIG. 1 shows a terminal featuring metal keys

FIG. 1 shows a terminal 10 featuring metal keys 12 that utilizes inductive button technique for capturing operator inputs. The surface of the terminal 10 facing the notional operator is divided into discernible regions to arrange the metal keys 12 according to their intended primary functions. Accordingly, the metal keys 12 that are earmarked to perform input functions are arranged in the input region 13a. Those that are designated for cursor control are arranged in the navigational region 13b. The metal keys 12 that are used for controlling and performing operations are grouped together in the functional region 13c. The metal keys 12 intended for trouble-shooting and maintenance are arranged in the diagnostic region 13d. The terminal 10 also features a display unit 14 that outputs either a visual signal or a value or both. Terminal 10 is typically accompanied with a measuring device such as a bench scale used in industrial environments. Hence, the terminal 10 and its metal keys 12 are made of durable materials such as stainless steel in order to withstand harsh industrial environments besides allowing frequent power wash routines for maintaining hygiene standards. A key determination method of the present invention is implementable through any metal keys 12 and realize the benefits of a terminal 10 having fewer keys yet capable of performing several functions taking advantage of the press models.

Figure 2:
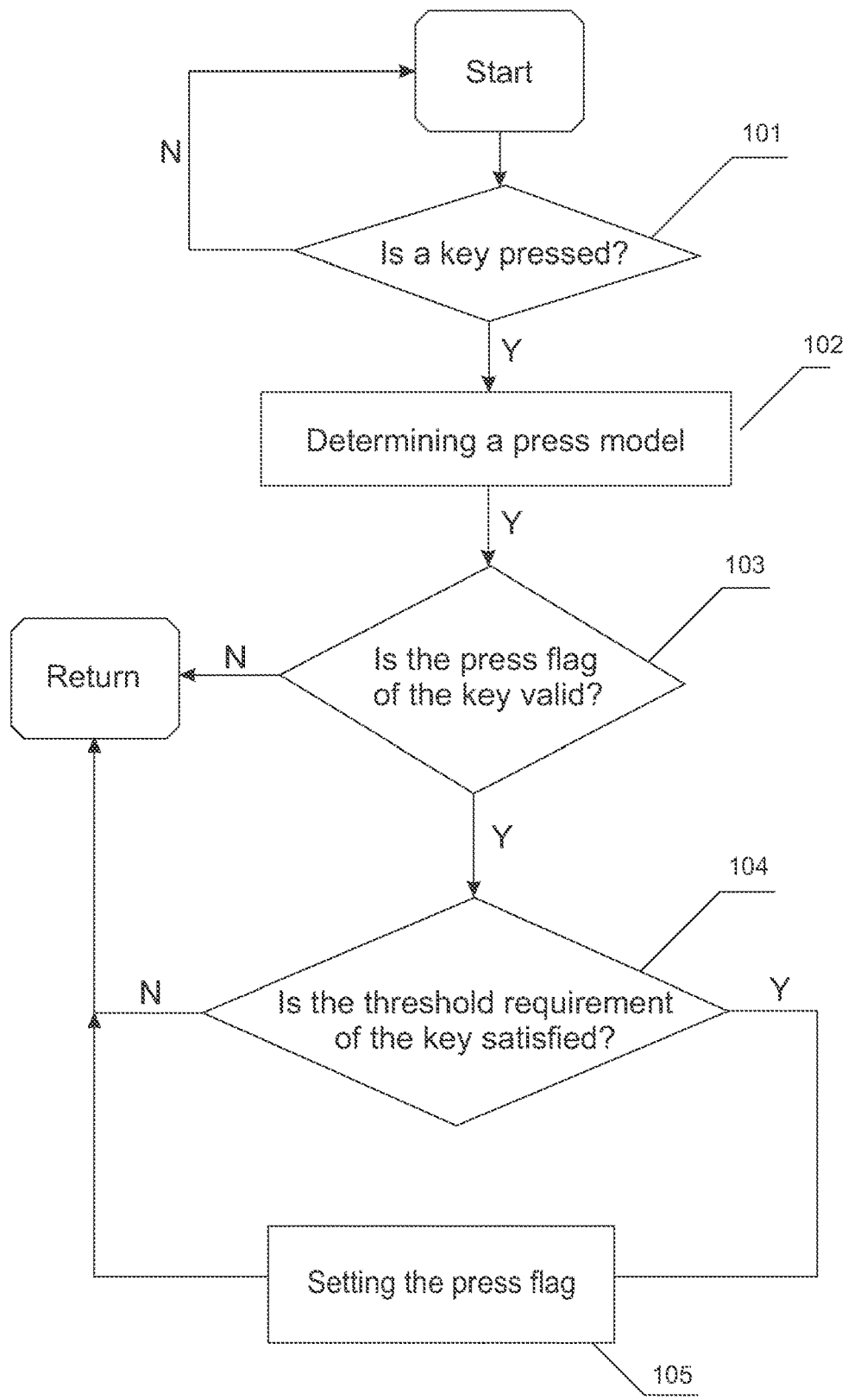
FIG. 2 shows a flowchart of setting a press flag in a key determination method for a metal key of the present invention.
Figure 3:
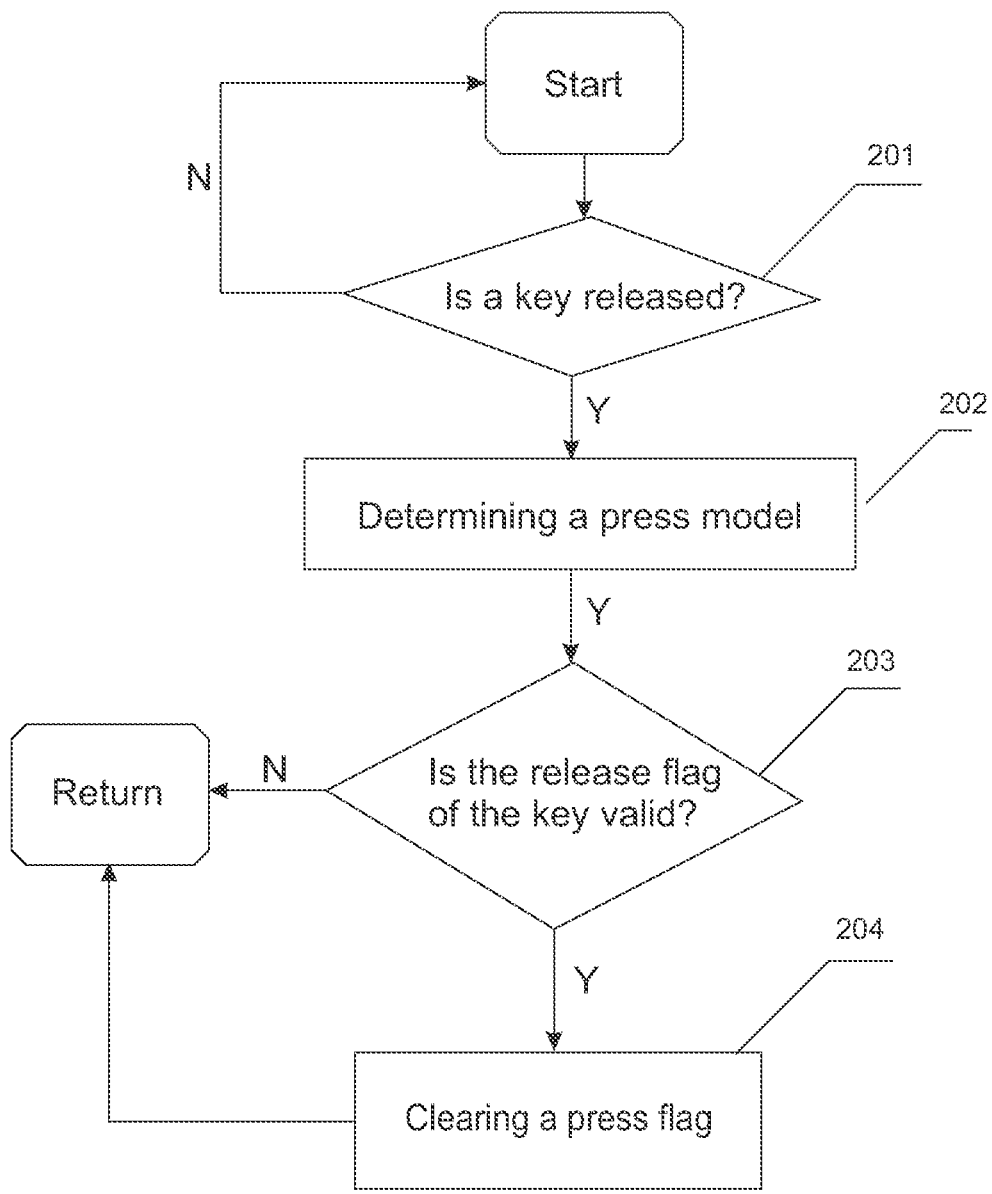
FIG. 3 shows a flowchart of clearing a press flag in the key determination method for a metal key of the present invention.

FIG. 2 shows a flowchart of setting a press flag in a key determination method for a metal key of the present invention. FIG. 3 shows a flowchart of clearing a press flag in the key determination method for a metal key of the present invention.

The present embodiment will be explained with particular reference to four metal keys A, B, C, and D arranged in the functional region 13c of the terminal 10, as shown in FIG. 1. It must be noted that the key determination method can be implemented successfully on any metal key 12 of the terminal 10. In an initial state, when the metal keys A to D are not pressed, the press flags of the metal keys A to D are set to 0.

Referring to FIG. 2, in step S101 it is determined whether a metal key is pressed. If no metal key is pressed, the control returns to start and continues to wait.

In this step, a vibration sensor can be used to detect vibration, so as to determine whether a metal key is pressed. For example, if no metal key is pressed, an output signal from the vibration sensor returns 0 thereby confirming that no metal key is pressed. In case, a metal key is pressed, an output signal from the vibration sensor changes due to pressure, thus determining vibration and confirming that a metal key has been pressed.

Once the pressing of the metal key A is registered, step S102 involves first determining a press model of the metal key A according to a first determination parameter of the metal key A.

The first determination parameter here refers to a plurality of continuous values obtained by the electrical parameter converter. Under different pressing actions, the distance between a press key of the metal key and an induction coil changes, so that the first determination parameter changes, resulting in different signal curves. A press model is then determined by performing dynamic analysis of the curves thus generated. For example, parameters such as slope change, change rate, etc., are determined by analysing the curves.

Pre-set press models can be divided into several types such as short press or long press models according to the length of the press duration, quick press or slow press models according to the speed of pressing, or gradually pressing force-applied press or gradually pressing force-decreased press models according to change trends of values output by the electrical parameter converter, or various other key press models formed in any combination of the foregoing press styles. In addition, a simple press model can be used, for example: a monotonically increasing model in which, the values output by the electrical parameter converter gradually increase at each sampling time; or a step-wise rising model in which, the values output by the electrical parameter converter are alternately increased, maintained, increased, and maintained at each sampling time; or a jitter raising model in which, the values output by the electrical parameter converter are alternately increased, decreased, increased, and decreased at each sampling time; or other combined models with the values output by the electrical parameter converter changed.

Step S103 firstly involves determining whether a press flag of the metal key A is valid. If the press model of the metal key A is consistent with any of the pre-set press models, then it is considered that the press flag of the metal key A is valid. Step S104 involves determining whether the value output by the electrical parameter converter satisfies at least one of the levels of threshold. In step S105 the press flag of the metal key A is set to 1. The process then returns to step S101 and repeats the steps hitherto described.

In the present invention, different applications are set according to different levels of thresholds for implementing different functions. For example, a metal key is set with 3 levels of thresholds, wherein if the value output by the electrical parameter converter satisfies the first level of threshold, it indicates resetting, and the first level of threshold has the minimum value. In the same example, if the value output by the electrical parameter converter satisfies the second level of threshold, it indicates weighing, and the second level of threshold has a value greater than that of the first level; and if the value output by the electrical parameter converter satisfies the third level of threshold, it indicates calibrating, and the third level of threshold has the maximum value. From the above example, it is clear that various functions can be realized using the same metal key, so that external personnel cannot recognize the specific function of a given pressing style, and therefore the effect of confidentiality is achieved.

The thresholds are also dynamically adjustable in combination with signals from other sensors. As an application, a sensor that senses environmental vibration can adjust the threshold in combination with the strength of a vibration signal to meet more application requirements of a user. For example, a sensor that is installed on a vibrating device can better recognize a human induced pressing operation by detecting the environmental vibration to change a key trigger threshold, without causing false triggering. In case, the vibration caused by environment is at a fixed frequency, while the human induced pressing operation is at a varying frequency, and thus it can be determined, according to the values output by the electrical parameter converter, whether the vibration is regular, and if so, it is considered that the threshold trigger is caused by the vibration due to the environment, and if not, it is considered that the vibration is caused by the human induced pressing operation. In another scenario where an instrument fitted with a metal key described in the instant invention is subjected to a jitter caused as a result of another object colliding with a surface (desk or work bench) on which the given instrument is placed. Ordinarily, the jitter thus introduced due to collision can result in setting the metal key. However, the proposed method distinguishes the vibration resulting from the collision as accidental and irregular, rather than a human induced pressing operation performed with an intent to set the metal key.

In addition, if a metal key instantaneously obtains a plurality of values output by the electrical parameter converter, and all the values satisfy the pre-set thresholds, it is considered that a plurality of metal keys are pressed. At this instance, a user can set out to determine, according to the number of pressed metal keys, whether the vibration thus recorded is a result of an external interference (such as an electromagnetic interference) or is a result of a genuine human-induced pressing operation. In case the vibration is found to be a result of an external interference, no press flag is set.

If the value output by the electrical parameter converter does not satisfy any level of threshold in step S103, the process returns to step S101.

If the press model of the metal key A is inconsistent with any of the pre-set press models in step S103, it is determined that the press flag of the metal key A is invalid, and the process returns to step S101 again.

Similarly, the setting of press flags for the metal keys B, C, and D is determined according to steps S102 to S105.

In step S104, the thresholds may also be dynamically adjusted in combination with signals from other sensors. For example, a sensor that senses environmental vibration can adjust the threshold in combination with the strength of a vibration signal to meet more application requirements of a user. For example, a sensor that is installed on a vibrating device can better recognize a human induced pressing operation by accounting for the environmental vibration and thereby changes a key trigger threshold avoiding false triggering.

In addition, in steps S103 and S104, if a plurality of values output by the electrical parameter converter are instantaneously obtained, and all the values satisfy thresholds, it is considered that a plurality of metal keys are pressed. At this time, a user can set out to determine, according to the number of pressed metal keys, whether the vibration is an external interference (such as an electromagnetic interference) instead of a human induced pressing operation. If the vibration is found to be a result of an external interference, no press flag is set.

Referring to FIG. 3, step S201 is about determining whether an operation is performed for releasing a metal key. If no metal key is released, the control returns to start and waits for a suitable input value. In this step, a sensor can be used to detect vibration, so as to determine the release of a metal key.

After the metal key A is released, the step S202 of determining a press model of the metal key A according to a second determination parameter of the metal key is performed first.

Here the second determination parameter refers to a plurality of continuous values obtained by the electrical parameter converter. Under different pressing actions, the distance between a press key of the metal key and an induction coil changes, so that the second determination parameter changes, resulting in different signal curves, and a press model is determined by dynamic analysis of the curves, e.g., slope change, change rate, etc.

Similarly, pre-set press models can be divided into short press or long press models according to the length of the press duration; or quick press or slow press models according to the speed of pressing; or gradually pressing force-applied press or gradually pressing force-decreased press models according to change trends of values output by the electrical parameter converter; or various different key press models formed in any combination of the foregoing press styles. In addition, the existing press model may be used, for example: a monotonically increasing model in which, the values output by the electrical parameter converter gradually increase at each sampling time; a stepwise rising model in which, the values output by the electrical parameter converter are alternately increased, maintained, increased, and maintained at each sampling time; a jitter raising model in which, the values output by the electrical parameter converter are alternately increased, decreased, increased, and decreased at each sampling time; or other combined models with the values output by the electrical parameter converter changed.

Step S203 firstly involves determining whether a release flag of the metal key A is valid. If the press model of the metal key A is consistent with any of the pre-set press models, then the metal key A is considered to be released and the release flag thereof is valid; and at this time, step S204 of clearing the press flag, i.e., setting the value of the press flag to 0, is performed. In case if the press model of the metal key A is inconsistent with any of the pre-set press models, the release flag of the metal key A is treated as invalid, and the process returns to step S201.

Similarly, steps S201 to S204 are followed for clearing the press flags for the metal keys B, C, and D.

In the present embodiment, a press flag for an un-pressed metal key is initially set to 0, and the press flag thereof indicates 1 after being set, and vice versa.

In this embodiment, multiple levels of thresholds and functions corresponding to respective levels of thresholds can be set according to the values output by the electrical parameter converter, so that one metal key realizes different functions. For convenience of use, a frequently used function may be set in a way so that it is easy to trigger, that is, the threshold level is set lower, and on the other hand a function related to a special process is set to be difficult to trigger, that is, the threshold level is set higher. The multiple levels of thresholds may be set according to the needs of the users. By means of multiple levels of thresholds, external personnel cannot recognize the specific function of a given pressing style, so that the effect of confidentiality is achieved.

In a still further embodiment, the duration after a press flag of a metal key is set is recorded. If the duration after a press flag of a metal key is set is within the range of a pre-set value, the metal key is considered to be pressed. In case the duration exceeds the pre-set value, the press flag of the metal key is forcibly cleared.

The pre-set value may be set by the end users as per their requirement, and in the present embodiment it is set to 5s. The working of the present method will now be described in detail. Initially, the metal keys A to D remain in an un-pressed state. The metal key B is released after an initial pressing for a duration of 6s. The analysis method is as follows.

According to steps S101 to S105, the press flag of the metal key B is set to 1, and at this instance, time recording begins.

Then, steps S202 through S204 are performed, and when the duration for which the metal key B is set reaches a pre-set value of 5s, the press flag thereof is forcibly cleared. Although the metal key B is not released, it is considered, in the key determination method, that a release flag of the metal key B is valid, and the press flag of the metal key B is now set as 0.

If another metal key such as key C is pressed within 5s to 6s and the pressing style meets a threshold requirement, a press flag for the exemplary metal key C is set to 1 according to steps S101 to S105. The key determination method proceeds to steps S202 through S204 to detect whether the metal key C is released.

Once the duration for which the metal key B is pressed reaches 6s, the metal key B is released, and the press flag thereof will still be cleared according to steps S201 to S204.

In this embodiment, the duration for which the metal key is set is timed, and if this duration is greater than a pre-set value, the set flag is forcibly cleared according to the key determination method. The pre-set value may be set according to needs of the users. In addition, within the duration for which the metal key is set, the influence of other operations on the pressed metal key is avoided, so that the operation is high in accuracy, simple, reliable, and low in cost.

In a still further embodiment, by using the key determination method of the present invention, on the basis of keeping a hardware structure of a metal key unchanged, different press models and different thresholds can be selected and configured by means of software, so that personalized choices are provided for respective metal keys, which effectively facilitates different operators in configuring a metal keyboard according to usage habits, thereby improving the operating efficiency. In addition, the setting of different thresholds effectively protects the operation purposes of the operators, thereby achieving the effect of confidentiality.

In another embodiment, a weighing instrument applying one or more metal keys described above is provided. By configuring a relationship between different press models and instrument operations, operators determine the press model corresponding to each press operation, and match the corresponding instrument function according to the method above, all operations of the weighing instrument can be performed with the use of few metal keys making the interface of the instrument simple and attractive. In the instant embodiment, a metal key featuring a tare can also double as a button for calibration simply by changing the press model.

From the description so far of the key determination method, it can be clearly understood by those skilled in the art that the present invention can be implemented by means of software and necessary hardware platforms. Based on such understanding, the technical solutions of the present invention, essentially or for a contribution part in the prior art, can be embodied in the form of a software product, wherein the computer software product may be stored in a storage medium, comprising but not limited to a ROM/RAM (Read Only Memory/Random Access Memory), a magnetic disk, an optical disk, etc., and may comprise several instructions for causing one or more computer devices (which may be a personal computer, a server, or a network device, or the like) to perform the manner described in the various embodiments or in certain parts of the embodiments of the present invention.

The key determination method of the present invention may be described in the general context of a computer executable instruction executed by a computer, for example, a program module. Generally, the program module includes a program, an object, a component, a data structure, and the like that perform a particular task or implement a particular abstract data type. The present invention may also be practiced in distributed computing environments in which the tasks are executed by remote processing devices that are connected via a communications network. In the distributed computing environments, the program module may be located in local and remote computer storage media that include a storage device.

It can be apparent to a person skilled in the art that various modifications and variations may be made to the exemplary embodiments of the present invention without departing from the spirit and scope of the present invention. Therefore, it is intended that the present invention covers the modifications and variations to the present invention that fall within the scope of the appended claims and the equivalent technical solutions thereof.

REFERENCE SIGNS LIST terminal 10
metal keys 12
input region 13*a*
navigational region 13*b*
functional region 13*c*
diagnostic region 13*d*
display unit 14
metal keys relevant for key determination method A, B, C, & D

The invention claimed is:

1. A method for operating a metal key arranged on a user interface comprising a plurality of metal keys, said method comprising:
    pressing the metal key;
    determining that a press flag of the metal key is valid by determining a press model of the metal key and determining that the press model is consistent with a pre-set press model;
    determining that values output by an electrical parameter converter on the metal key satisfy multiple levels of thresholds; and
    in response to determining that the press model is consistent with the pre-set press model and the values output by the electrical parameter converter on the metal key satisfy the multiple levels of thresholds, setting the press flag of the metal key according to the multiple levels of thresholds.

2. The method of claim 1, wherein;
    a correlation between the values output by the electrical parameter converter and the multiple levels of thresholds is set; and
    the multiple levels of thresholds correspond to different applications.

3. The method of claim 2, wherein the electrical parameter converter is a digital electrical parameter converter.

4. The method of claim 1, wherein the multiple levels of thresholds comprises thresholds, which are values that are dynamically set according to an output signal from a sensor.

5. The method of claim 1, wherein the method further comprises;
    instantaneously obtaining, at the metal key, a plurality of values output by the electrical parameter converter;
    determining that the plurality of values output by the electrical parameter converter satisfy the multiple levels of thresholds;
    determining a number of metal keys that obtain the values output by the electrical parameter converter; and
    determining that the press flag is to be set in response to determining that the plurality of values output by the electrical parameter converter satisfy the multiple levels of thresholds as well as the number of metal keys that obtain the values output by the electrical parameter converter.

6. The method of claim 1, wherein the method further comprises: determining that the values output by the electrical parameter converter satisfy the multiple levels of thresholds upon detecting that the press flag of the metal key is valid.

7. The method of claim 1, wherein the method further comprises:
    determining a duration for which the press flag of the metal key is set; and
    determining that the duration is greater than a pre-set value, and in response, clearing the press flag of the metal key.

8. The method of claim 1, wherein the method further comprises: upon releasing the metal key, determining that a release flag is valid according to a press model, and in response, clearing the press flag that was previously set.

9. The method of claim 8, wherein, upon releasing the metal key, determining that the press model of the metal key is consistent with the pre-set press model, and in response, determining that the release flag is valid.

10. The method of claim 1, wherein the pre-set press model is selected from the group consisting of: a monotonically increasing model, or a stepwise rising model, or a jitter raising model, and a combined model of any two of the monotonically increasing model, the stepwise rising model and the jitter raising model, or a combined model of the monotonically increasing model, the stepwise rising model and the jitter raising model.

11. The method of claim 1, wherein the method comprises:
releasing the metal key; and
determining that a release flag of the metal key is valid according to a press model, and in response, clearing the press flag.

12. A metal key applying the method of claim 1.

13. The method of claim 1, wherein the multiple levels of thresholds comprises thresholds, which are pre-set values.

14. An electronic weighing instrument comprising:
a user interface;
a plurality of metal keys arranged at the user interface;
one or more processors; and
one or more non-transitory storage media comprising a stored program, which when executed, configures the one or more processors to:
receive data generated from a user pressing a given one of the plurality of metal keys;
determine whether a press flag of the given metal key is valid by determining a press model of the given metal key and by determining whether the press model is consistent with a pre-set press model;
determine whether values output by an electrical parameter converter on the given metal key satisfy multiple levels of thresholds; and
set the press flag of the given metal key according to the multiple levels of thresholds when the press model is consistent with a pre-set press model and the values output by the electrical parameter converter on the given metal key satisfy multiple levels of thresholds.

15. A non-transitory storage medium, comprising a stored program, wherein the stored program, upon execution, controls an apparatus comprising a metal key arranged on a user interface comprising a plurality of metal keys and the storage medium to:
receive data generated from a user pressing the metal key;
determine whether a press flag of the metal key is valid by determining a press model of the metal key and by determining whether the press model is consistent with a pre-set press model;
determine whether values output by an electrical parameter converter on the metal key satisfy multiple levels of thresholds; and
set the press flag of the metal key according to the multiple levels of thresholds when the press model is consistent with a pre-set press model and the values output by the electrical parameter converter on the metal key satisfy multiple levels of thresholds.

* * * * *

UNITED STATES PATENT AND TRADEMARK OFFICE
CERTIFICATE OF CORRECTION

PATENT NO. : 11,762,480 B2
APPLICATION NO. : 17/789855
DATED : September 19, 2023
INVENTOR(S) : Wang et al.

Page 1 of 1

It is certified that error appears in the above-identified patent and that said Letters Patent is hereby corrected as shown below:

On the Title Page

Item (57) Abstract, Line 15, please delete "mean" and insert -- meant --.

In the Claims

In Column 10, Line 26, Claim 2, please delete ";" and insert -- : --.

In Column 10, Line 28, Claim 5, please delete ";" and insert -- : --.

Signed and Sealed this
Fifth Day of December, 2023

Katherine Kelly Vidal
*Director of the United States Patent and Trademark Office*